United States Patent [19]
Weng et al.

[11] Patent Number: 5,978,956
[45] Date of Patent: Nov. 2, 1999

[54] FIVE-ERROR CORRECTION SYSTEM

[75] Inventors: Lih-Jyh Weng, Needham; Ba-Zhong Shen, Shrewsbury, both of Mass.

[73] Assignee: Quantum Corporation, Milpitas, Calif.

[21] Appl. No.: 08/984,698

[22] Filed: Dec. 3, 1997

[51] Int. Cl.⁶ .................................................. H03M 13/00
[52] U.S. Cl. ......................... 714/784; 714/759; 714/782
[58] Field of Search ................................... 714/759, 782, 714/784

[56] References Cited

U.S. PATENT DOCUMENTS 5,710,782  1/1998  Weng ....................................... 371/37.1
5,905,740  5/1999  Williamson ........................... 371/37.11

*Primary Examiner*—Stephen M. Baker
*Attorney, Agent, or Firm*—Cesari & McKenna

[57] ABSTRACT

An error correcting system transforms a degree-five error locator polynomial $\sigma(x)$ into the polynomial $w(y)=y^5=b_2y^2+b_1y+b_0$, where $b_1=0$ or 1, and $y=\sigma(x)$, and determines the roots of $\sigma(x)$ based on the roots of $w(y)$. The polynomial $w(y)$ has $(2^M)^2$ solutions over $GF(2^M)$, rather than $(2^M)^5$ solutions, since for any solution with $b_2=h_2$, $b_0=h_0$ and $b_1=1$, there is no such solution with $b_2=h_2$, $b_0=h_0$ and $b_1=0$. Conversely, if there is such a solution with $b_1=0$ there are no such solutions with $b_1=1$. The system can thus use a table that has $2^{2M}$ entries and is addressed by $\{b_2, b_0\}$. The table produces roots $y=r_i$, i=0, 1, 2, 3, 4, and the system then transforms the roots $y=r_i$ to the roots of $\sigma(x)$ by calculating $x=\sigma^{-1}(y)$. To further reduce the overall table storage needs, the table may include in each entry four roots $r_i$, i=0, 1, 2, 3, and the system then calculates the associated fifth root $r_4$ by adding the stored roots. The size of the look-up table can be even further reduced by (i) segmenting the Galois Field $(2^M)$ into conjugate classes; (ii) determining which of the classes contain values of $b_0$ that correspond to solutions of $w(y)$ with five distinct roots; (iii) representing each of these classes, respectively, by a single value of $b_0'=(b_0)^{2^k}$; and (iv) including in the table for each class only those solutions that correspond to representative values of $b_0'$. The table then contains a relatively small number of sets of roots of each of the classes, with each set associated with a particular value of $b_2'=b_2^{2^k}$. The roots of $w(y)$ are determined by finding the value of k that produces $b_0'$ and $b_2'$, entering the look-up table using $\{b_0', b_2'\}$, raising the roots $r_i'$ produced by the table to the power $-2^k$ to produce $y=r_i$, and then transforming the result into the roots of $\sigma(x)$ by $x=\sigma^{-1}(y)$.

30 Claims, 3 Drawing Sheets

FIVE-ERROR CORRECTION SYSTEM

FIELD OF THE INVENTION

This invention relates generally to data processing systems and, more particularly, to a system for decoding and correcting errors in data using an error correction code.

BACKGROUND OF THE INVENTION

Data stored on magnetic media, such as a magnetic disks, are typically stored in encoded form, so that errors in the stored data can possibly be corrected. The errors may occur, for example, because of inter-symbol interference, a defect in the disk, or noise. As the density of the data stored on the disk increases, more errors are likely, and the system is required to correct greater numbers of errors, which include greater numbers of burst errors. A burst error is typically defined as a contiguous number of symbols in which the first symbol and the last symbol are erroneous. The speed with which the system corrects the errors, including the burst errors, is important to the overall speed with which the system processes the data.

Prior to recording, multiple-bit data symbols are encoded using an error correction code (ECC). When the data symbols are retrieved from the disk and demodulated, the ECC is employed to, as the name implies, correct the erroneous data.

Specifically, before a string of k data symbols is written to a disk, it is mathematically encoded using an (n, k) ECC to form n-k ECC symbols. The ECC symbols are then appended to the data string to form an n-symbol error correction code word, which is then written to, or stored, on the disk. When the data are read from the disk, the code words containing the data symbols and ECC symbols are retrieved and mathematically decoded. During decoding, errors in the data are detected and, if possible, corrected through manipulation of the ECC symbols [for a detailed description of decoding see, Peterson and Weldon, *Error Correction Codes,* 2nd Ed. MIT Press, 1972].

To correct multiple errors in strings of data symbols, the system typically uses an ECC that efficiently and effectively utilizes the various mathematical properties of sets of symbols known as Galois fields. Galois fields are represented "GF ($P^M$)", where "P" is a prime number and "M" can be thought of as the number of digits, base "P", in each element or symbol in the field. P usually has the value 2 in digital computer and disk drive applications and, therefore, M is the number of bits in each symbol. The ECC's commonly used with the Galois Fields are Reed Solomon codes or BCH codes.

There are essentially four major steps in decoding a corrupted code word of a high rate Reed-Solomon code or a BCH code. The system first determines error syndromes that are based on the results of a manipulation of the ECC symbols. Next, using the error syndromes, the system determines an error locator polynomial, which is a polynomial that has the same degree as the number of errors. The system then finds the roots of the error locator polynomial and from each root determines the location of an associated error in the code word. Finally, the system finds error values for the error locations.

The steps of determining the syndromes and finding the error locations are the most time consuming in the error correction process. This invention relates to the step of finding the error locations.

While "fast" methods for finding four or fewer errors are known, prior known systems find the error locations for degree-five error locator polynomials by performing a time consuming Chien search. The Chien search is a systematic trial and error approach that involves trying each element of the applicable Galois field as a root of the error locator equation. If the Galois Field is relatively large, the Chien search takes a long time, and thus, slows the error correction operation. An alternative to the Chien search is to use a lookup table that is entered with the coefficients of the error locator polynomial. To correct five errors, the associated lookup table is prohibitively large since it must include all possible distinct roots for the degree-five error locator polynomials. In GF($2^M$) the lookup table has $(2^M)^5$ entries. For systems that use 8-bit symbols, the lookup table has $(2^8)^5$ or $2^{40}$ entries, with each entry including five 8-bit roots of the error locator polynomial. For many systems, the lookup table takes up too much storage space. This is particularly true as larger Galois Fields are used to protect more data.

SUMMARY OF THE INVENTION

An error correcting system transforms a degree-five error locator polynomial $$\sigma(x)=x^5+a_4x^4+a_3x^3+a_2x^2+a_1x+a_0 \quad [1]$$

into $$w(y)=y^5+b_2y^2+b_1y+b_0 \quad [2]$$

where $b_1=0$ or 1, and $y=t(x)$, and determines the roots of equation 1 based on equation 2. Equation 2 has ($2^M$) solutions over GF($2^M$), rather than $(2^M)^5$ since for any solution with $b_2=h_2$, $b_0=h_0$ and $b_1=1$, there is no such solution with $b_2=h_2$, $b_0=h_0$ and $b_1=0$. Conversely, if there is such a solution with $b_1=0$ there is no such solutions with $b_1=1$. The system can therefore use a table that has $2^{2M}$ entries which is addressed by $\{b_2, b_0\}$. The table produces roots $y=r_i$, $i=0, 1 \ldots ,4$, and the system then transforms the roots $y=r_i$ to the roots of equation 1 by $x=t^{-1}(y)$ where $t^{-1}()$ is the inverse of $t()$. The size of the look-up table has thus been reduced from $2^{5M}$ entries to $2^{2M}$ entries. To further reduce the overall table storage needs, the table may include in each entry four roots $r_i$, $i=0, 1 \ldots 3$ and the system then calculates the associated fifth root $r_4$ by adding the stored roots.

The size of the look-up table can be even further reduced by (i) segmenting the Galois Field ($2^M$) into conjugate classes; (ii) determining which of the classes contain values of $b_0$ that correspond to solutions of equation 2 with five distinct roots; (iii) representing each of these classes, respectively, by a single value of $b_0'=(b_0)^{2^k}$; and (iv) including in the table for each class only those solutions that correspond to the representative values of $b_0'$. As discussed in more detail below, the table contains a relatively small number of sets of roots for each of the classes with each set associated with a particular value of $b_2'=b_2^{2^k}$. The roots of equation 2 are determined by finding the value of k that produces $b_0'$ and $b_2'$, entering the look-up table using $\{b_0', b_2'\}$, raising the roots $r_i'$ produced by the table to the power $-2^k$ to produce $y=r_i$, and then transforming the result into the roots of equation 1 by $x=t^{-1}(y)$.

As discussed below, the overall size of the table can again be reduced by using a set of tiered smaller tables, one tier based on $b_1'=1$ or 0, and a second tier based on the possible values of $b_2'$. The storage requirements of the table can then be further reduced by storing in each table entry four or fewer roots.

BRIEF DESCRIPTION OF THE DRAWINGS

The invention description below refers to the accompanying drawings, of which.

DETAILED DESCRIPTION OF AN ILLUSTRATIVE EMBODIMENT

A. The system

Figure 1:
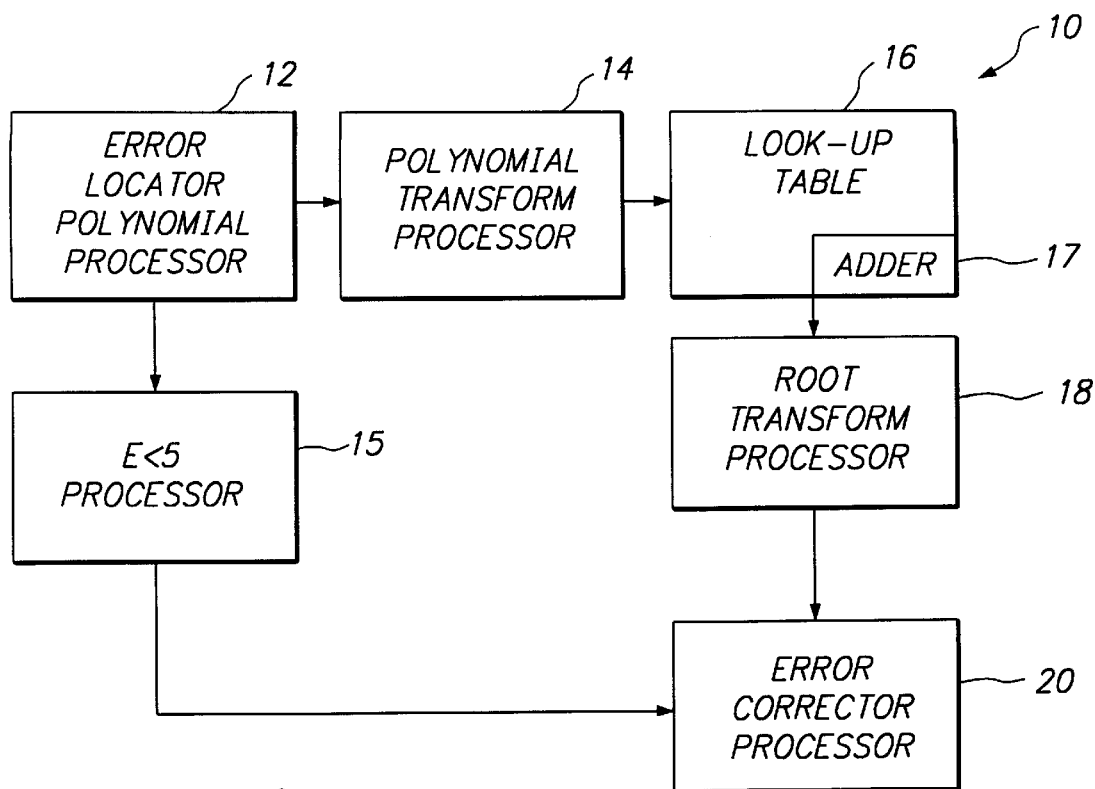
FIG. 1 is a functional block diagram of a system constructed in accordance with the invention.

Referring to FIG. 1, an error correcting system 10 includes an error locator polynomial processor 12 that operates in a conventional manner and manipulates a codeword that is encoded over $GF(2^M)$ to produce an error locator polynomial $\sigma(x)$. If the degree "e" of the error locator polynomial is less than 5, the system uses a processor 15 to find the roots of the equation using known "fast" techniques. If the error locator polynomial has degree 5, that is:

$$\sigma(x) = x^5 + a_4 x^4 + a_3 x^3 + a_2 x^2 + a_1 x + a_0 \qquad [1]$$

the error locator polynomial processor 12 supplies the polynomial to a polynomial transform processor 14, which transforms the error locator polynomial to $$w(y) = y^5 + b_2 y^2 + b_1 y + b_0 \qquad [2]$$

where $b_1$ equals either 0 or 1, and $y = t(x)$. The operations of the transform processor are discussed below in Section B.

In the embodiment of the system 10 shown in FIG. 1, a $2^{2M}$ entry look-up table 16 is entered using as the address a concatenation of $b_2$ and $b_0$. The look-up table produces sets of roots $y = r_i$ with $i = 0, 1 \ldots 4$. The roots are supplied to a root transform processor 18, which transforms the roots $y = r_i$ to $x = z_i$, where $x = t^{-1}(y)$ and $t^{-1}()$ is the inverse of $t()$. Using the five roots $x = z_i$, an error corrector processor 20 determines five associated error values and corrects errors in the data symbols of the codeword.

Preferably, the table 16 contains in each entry four roots $y = r_i$ with $i = 0, 1 \ldots 3$. The fifth root is then determined by an adder 17 that adds the four stored roots. For any degree-five polynomial, the sum of the roots is equal to the coefficient of the $y^4$ term. Thus, $r_0 + r_1 + r_2 + r_3 + r_4 = b_4$ and $b_4 = 0$. Accordingly, $r_4$ is equal to the sum $r_0 + r_1 + r_2 + r_3$.

In this first embodiment, the look-up table is reduced in size from the conventional $2^{5M}$ entries to $2^{2M}$ entries. For systems that use 8-bit symbols, i.e., in which M=8, the size of the table is reduced from $2^{40}$ entries to $2^{16}$ entries. Also, the storage requirements per entry are reduced by storing only four M-bit roots per entry.

Figure 2:
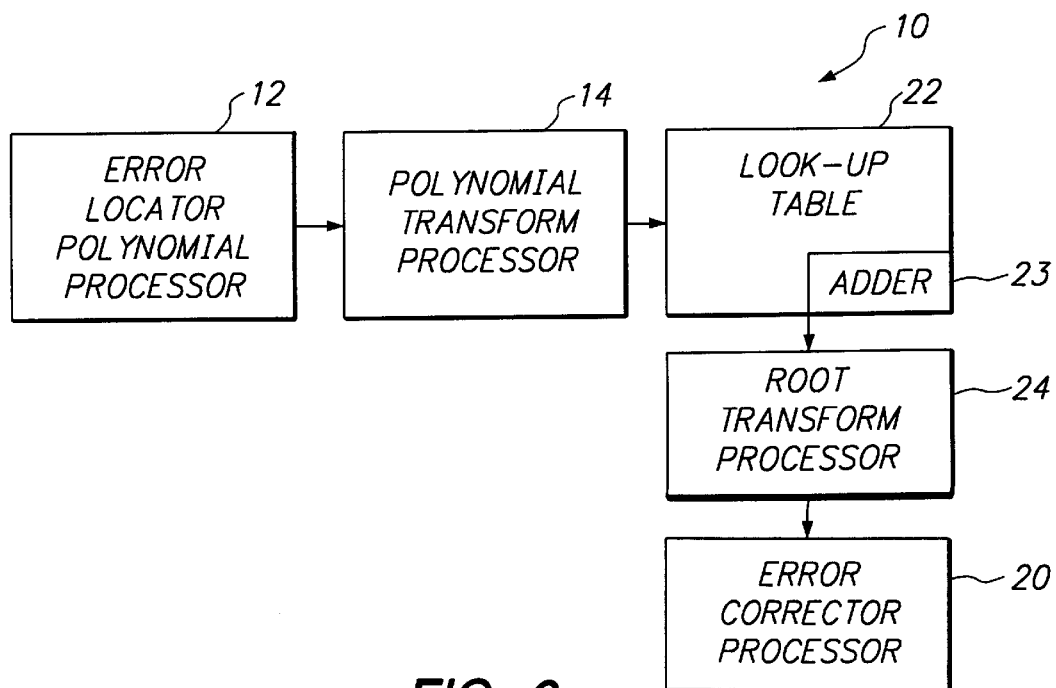
FIG. 2 is a functional block diagram of an alternative system constructed in accordance with the invention.

FIG. 2 depicts a second embodiment of the error correction system 10 that includes a look-up table 22, which is reduced in size to a number of entries that is a small percentage of $2^M$, and is thus significantly smaller than the conventional table that has $2^{5M}$ entries, or even the reduced-size table 16 (FIG. 1) that has $2^{2M}$ entries. The look-up table 22 is entered using values $b_2'$ and $b_0'$ that are associated with the $b_2$ and $b_0$ coefficients of equation 2 and with the conjugate classes of $GF(2^M)$, as discussed below.

A Galois Field $GF(2^M)$ can be separated into a number of conjugate classes, each with members $\alpha^i$, $(\alpha^i)^2$, $(\alpha^i)^{2^2}$, $(\alpha^i)^{2^3} \ldots (\alpha^i)^{2^k} \ldots (\alpha^i)^{2^{M-1}}$, where $\alpha$ is the primitive element of the Galois Field. As an example, the thirteen conjugate classes of $GF(2^6)$ expressed as powers of $\alpha$ are:

| | | | | | |
|---|---|---|---|---|---|
| $\alpha^0$ | | | | | |
| $\alpha^1$ | $\alpha^2$ | $\alpha^4$ | $\alpha^8$ | $\alpha^{16}$ | $\alpha^{32}$ |
| $\alpha^3$ | $\alpha^6$ | $\alpha^{12}$ | $\alpha^{24}$ | $\alpha^{48}$ | $\alpha^{33}$ |
| $\alpha^5$ | $\alpha^{10}$ | $\alpha^{20}$ | $\alpha^{40}$ | $\alpha^{34}$ | |
| $\alpha^7$ | $\alpha^{14}$ | $\alpha^{28}$ | $\alpha^{56}$ | $\alpha^{49}$ | $\alpha^{35}$ |
| $\alpha^9$ | $\alpha^{18}$ | $\alpha^{36}$ | | | |
| $\alpha^{11}$ | $\alpha^{22}$ | $\alpha^{44}$ | $\alpha^{25}$ | $\alpha^{50}$ | $\alpha^{37}$ |
| $\alpha^{13}$ | $\alpha^{26}$ | $\alpha^{52}$ | $\alpha^{41}$ | $\alpha^{19}$ | |
| $\alpha^{15}$ | $\alpha^{30}$ | $\alpha^{60}$ | $\alpha^{57}$ | $\alpha^{51}$ | $\alpha^{39}$ |
| $\alpha^{21}$ | $\alpha^{42}$ | | | | |
| $\alpha^{23}$ | $\alpha^{46}$ | $\alpha^{29}$ | $\alpha^{58}$ | $\alpha^{53}$ | $\alpha^{43}$ |
| $\alpha^{27}$ | $\alpha^{54}$ | $\alpha^{45}$ | | | |
| $\alpha^{31}$ | $\alpha^{62}$ | $\alpha^{61}$ | $\alpha^{59}$ | $\alpha^{55}$ | $\alpha^{47}$ |

A given conjugate class can be represented by one of its members $\alpha^i$ since every member of the class is equal to $(\alpha^i)^{2^k}$ for k equal to $1, \ldots, M-1$, and can be produced by the repeated squaring of $\alpha^i$.

We are interested only in solutions to equation 2 that have five distinct roots, since these solutions point to correctable errors. The values of the coefficient $b_0$ that are associated with equations of the form of equation 2 that have five distinct roots fall within a subset of the total number of conjugate classes. In the example, the subset includes "c" conjugate classes, where $C \leq 13$. The set of values of $b_0$ that are of interest can thus by fully represented by the C conjugate classes, and each class can, in turn, be represented by a single member $\alpha^j$, which we refer to herein as $b_0'$. The $b_0'$ in this example is the member of the class that has the smallest exponent. The $b_0'$ may instead be the member with the smallest or largest weight (number of 1s), the member with the smallest "value" determined by the placement of the 1s in the various symbols, or the member with the largest exponent. For each of the C values of $b_0'$ there are a limited number of values of $b_2'$ that correspond to the equations with five distinct roots. Accordingly, the table need contain only the roots that correspond to the equations that have these particular values of the coefficients $b_0'$ and $b_2'$.

Consider an equation of the form $$h(x) = x^n + q_{n-1} x^{n-1} + \ldots + q_1 x^1 + q_0 = 0 \qquad (3)$$

with s roots $r_i$. Substituting the roots into equation 3

$$h(r_i) = r_i^n + q_{n-1} r_i^{n-1} + \ldots + q_1 r_i + q_0 = 0$$

and raising both sides to the power $2^k$:

$$[h(r_i)]^{2^k} = [r_i^n + q_{n-1} r_i^{n-1} + \ldots + q_1 r_i + q_0]^{2^k} = [r_i^{2^k}]^n + [q_{n-1}^{2^k}]*[r_i^{2^k}]^{n-1} + \ldots + [q_0^{2^k}] = 0 \qquad (3')$$

the roots of equation 3' are $r_i' = (r_i)^{2^k}$ for $k = 0, \ldots, M-1$. Thus, an equation of the form of equation 2:

$$w(y) = y^5 + b_2 y^2 + b_1 y + b_0 = 0 \qquad (2)$$

raised to the $2^k$ power:

$$w'(y) = (y^5)^{2^k} + (b_2)^{2^k}(y^2)^{2^k} + (b_1)^{2^k} y^{2^k} + (b_0)^{2^k} = (y^5)^{2^k} + b_2'(y^2)^{2^k} + b_1' y^{2^k} + b_0' = 0 \qquad (5)$$

has roots $(r_i)^{2^k} = r_i'$, where $r_i$ are the roots of equation 2.

The values $b_2'$ and $b_0'$ from equation 5 are used to enter the look-up table 22 and extract the roots $r_i'$ of equation 5. The system, in root transform processor 24, raises the roots $r_i'$ to the power $-2^k$ to produce the roots $y = r_i$ of equation 2. The root transform processor then produces the roots of equation 1 as $x = t^{-1}(y)$. As discussed below in an example, the number of entries in the look-up table 22 is a small percentage of $2^M$, which is significantly smaller than the $2^{5M}$ entries of a conventional look-up table.

Continuing our example in GF($2^6$) an equation of the form of equation 2:

$$w(y)=y^5+b_2y^2+b_1y+b_0=0$$

has five distinct roots in GF($2^6$) only if $b_0$ belongs to one of the following five conjugate classes:

| | | | | | |
|---|---|---|---|---|---|
| $\alpha^0$ | | | | | |
| $\alpha^1$ | $\alpha^2$ | $\alpha^4$ | $\alpha^8$ | $\alpha^{16}$ | $\alpha^{32}$ |
| $\alpha^5$ | $\alpha^{10}$ | $\alpha^{20}$ | $\alpha^{40}$ | $\alpha^{17}$ | $\alpha^{34}$ |
| $\alpha^{13}$ | $\alpha^{26}$ | $\alpha^{52}$ | $\alpha^{41}$ | $\alpha^{19}$ | $\alpha^{38}$ |
| $\alpha^{27}$ | $\alpha^{54}$ | $\alpha^{45}$ | | | |

These five conjugate classes can be fully represented by, for example, a set that contains for each class the member, $b_0'$, with the smallest exponent. The classes are thus represented by the set:

$$S=\{\alpha^0, \alpha^1, \alpha^5, \alpha^{13}, \alpha^{27}\}.$$

For each value of $b_0'$ in this set there is a small set of possible values for $b_2'$ for which the equation w'(y) in the form of equation 5 has five distinct solutions. Indeed, there are unique values of $b_2'$ associated, respectively, with $b_0'=\alpha^0$, $\alpha^1$, $\alpha^5$ or $\alpha^{13}$, and two $b_0'=\alpha^{27}$. In this particular example there are no solutions with five distinct roots associated with possible values for $b_2'$ associated with $b_1'=0$. Accordingly, all table entries correspond to $b_1'=1$.

All solutions with coefficients $b_0'$ and $b_2'$ that have five distinct roots are included in the following six-entry table:

TABLE 1

| $b_0'$ | $b_2'$ | $R_i'$ |
|---|---|---|
| $\alpha^0$ | 0 | $\alpha^9, \alpha^{19}, \alpha^{21}, \alpha^{36}$ |
| $\alpha^1$ | $\alpha^{23}$ | $\alpha^{22}, \alpha^{27}, \alpha^{43}, \alpha^{47}$ |
| $\alpha^5$ | $\alpha^{20}$ | $\alpha^{16}, \alpha^{21}, \alpha^{40}, \alpha^{49}$ |
| $\alpha^{13}$ | $\alpha^{46}$ | $\alpha^{24}, \alpha^{32}, \alpha^{41}, \alpha^{39}$ |
| $\alpha^{27}$ | $\alpha^0$ | $\alpha^9, \alpha^{14}, \alpha^{23}, \alpha^{49}$ |
| $\alpha^{27}$ | $\alpha^{45}$ | $\alpha^6, \alpha^{18}, \alpha^{37}, \alpha^{44}$ |

The table lists four roots of each address $\{b_0'b_2'\}$, and the fifth root is the sum $r_0+r_1+r_2+r_3=r_4$. Table 1 is substantially smaller than the table used in conventional systems, which includes ($2^6$)$^5$, or $2^{30}$, entries.

To use Table 1, the values of $b_0'=(b_0)^{2^k}$ and $b_2'=(b_2)^{2^k}$ must be determined, and thus, the value of k must be determined. The processor 14 squares the coefficient $b_0$ from equation 2 and increments k once for each squaring operation. The squaring operations continue until either the result is an element of the set S, or k exceeds M−1. Alternatively, the coefficient $b_0$ may be used to enter a table (not shown) that maps the value either to a value of k or to a "no solution" entry, which indicates that there are no solutions that have five distinct roots associated with that particular value of $b_0$. In the example, this table maps $b_0=0$ to the no solution entry.

Assuming $(b_0)^{2^k}=b_0'$ is in set S, the system calculates $b_2'=(b_2)^{2^k}$ and uses the values $b_0'$ and $b_2'$ to enter look-up table 22, which contains Table 1, and extract therefrom the stored roots $r_i'$. As necessary, an adder 23 adds the stored roots to produce an associated fifth root $r_4'$. The system then in root transform processor 24 raises the roots $r_i'$ to the $-2^k$ power, to determine the roots $r_i$ of equation 2, where $y=r_i=(r_i')^{-2^k}$. The root processor 24 next converts the roots $y=r_i$ to the roots of equation 1, $x=z_i$.

The number of roots included in each table entry may be reduced to three if the equation that includes the two unknown roots of equation 5.

Multiplying out the five factors (y−$r_i'$) of equation 5, and setting the coefficient of the cubed term equal to zero the system produces:

$$r_4'*(r_0'+r_1'+r_2'+r_3')+r_3'*(r_0'+r_1'+r_2')+r_2'*(r_1'+r_0')+r_1'*r_0'=0 \quad [6]$$

where "*" represents multiplication. Using the values of $r_0'$, $r_1'$ and $r_2'$ extracted from the table, equation 6 can be rewritten $$r_4'*(A+r_3')+r_3'*A+B=0 \quad [7]$$

where A and B are known quantities, and $A=r_0'+r_1'+r_2'$ and $B=r_2'*(r_1'+r_0')+r_1'*r_0'$. Equation 7 can then be rewritten as:

$$r_4'*r_3'+A*(r_4'+r_3')+B=0 \quad [8]$$

With $$r_4'*r_3'*r_2'*r_1'*r_0'=b_0'$$

and letting $c=r_0'*r_1'*r_2'$, we can substitute into equation 8:

$$\frac{b_0'}{c}=r_4'*r_3'$$

or $$r_4'=\frac{b_0'}{c*r_3'}$$

to produce:

$$\frac{b_0'}{c}+A\left(r_3'+\frac{b_0'}{c*r_3'}\right)+B=0$$

which is equal to $$Ar_3^{2'}+r_3\left(B+\frac{b_0'}{c}\right)+A\frac{b_0'}{C}=0$$

and thus $r_3'$ can be determined from $$z^2+z\left(\frac{B}{A}+\frac{b_0'}{AC}\right)+\frac{b_0'}{c}=0$$

where z is the only unknown, and $r_4'$ can then be determined from $r_3'$. The system then solves the quadratic equation using known techniques. Another way to produce the quadratic equation is to divide equation 5 by the factors (y+$r_i$) for i=0, 1, 2.

The number of roots stored in each table entry may be further reduced to one or two, with the system solving the associated degree-three and degree-four polynomials using known "fast" techniques.

Figure 3:
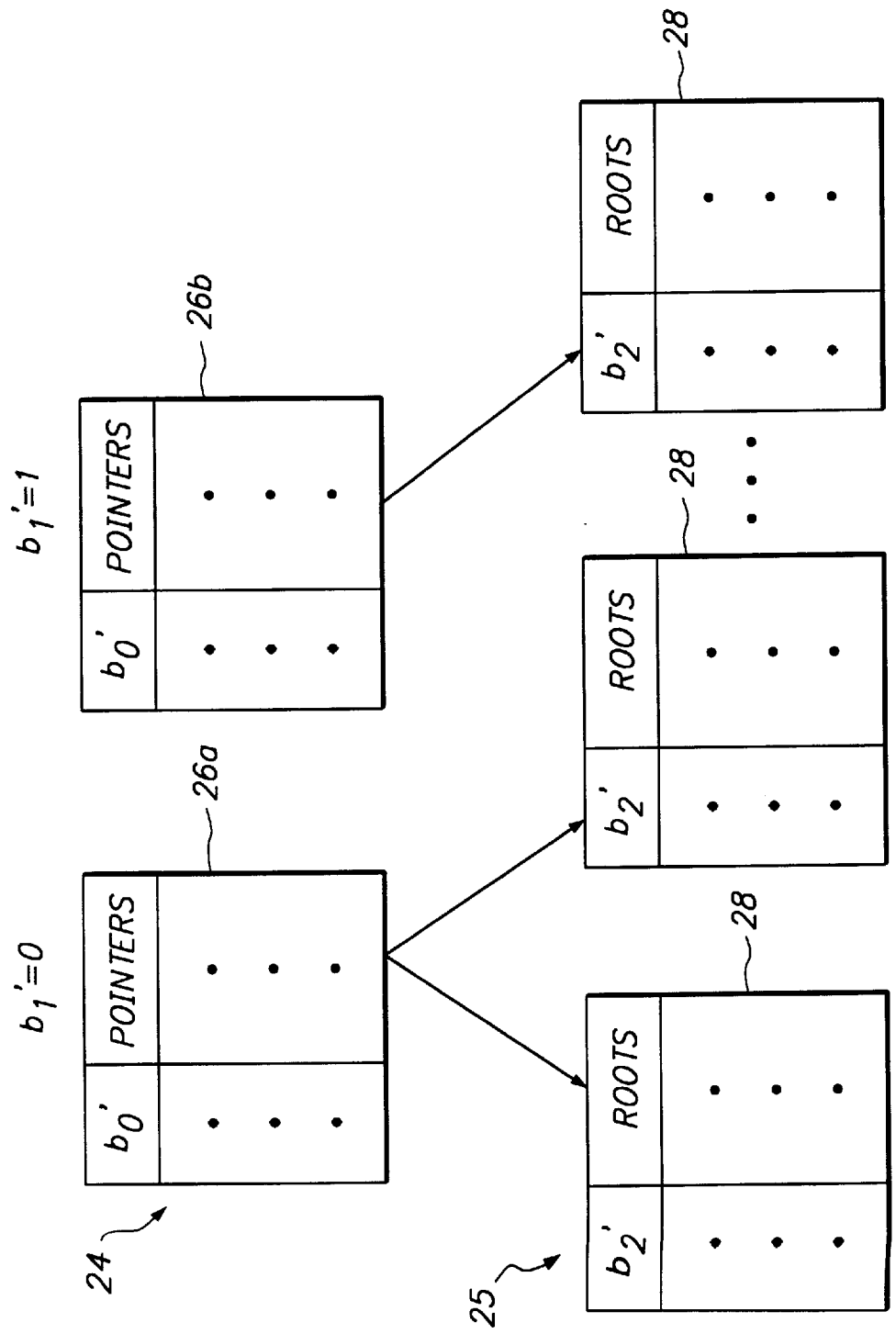
FIG. 3 is a diagram illustrating a two-tiered look-up table that may be used in the system of FIG. 2.

Referring now also to FIG. 3, the look-up table 22 may be arranged in two layers, or tiers 24 and 25. The first tier 24 includes two "master" tables 26a and 26b that are associated, respectively, with $b_1=0$ and $b_1=1$. Using $b_1'$ from equation 5, the system selects a master table. It then enters the selected master table using $b_0'$. The master table produces a pointer to the second tier 25 of tables 28, which are entered using the coefficient $b_2'$. In the example, there is a one-entry master table 26b for $b_1'=1$ that indicates there are no associated solutions that have five distinct roots, and a six-entry master table 26a for $b_1=0$ that includes pointers to five second tier tables 28, one table for each of the values of $b_0'$ that corresponds to a solution with five distinct roots. The master table 26a also includes a no solution entry that corresponds to all other values of $b_0'$. Three of these second-tier tables 28 each include two entries, namely, one for the associated value of $b_2'$ for which there are five distinct roots and one associated with a "no solution" value. The fourth table, which is associated with $b_0'=\alpha^{27}$, includes three entries, two associated with the two possible values of $b_2'$ for which there are five distinct roots and one associated with the no solution value.

Figure 4:
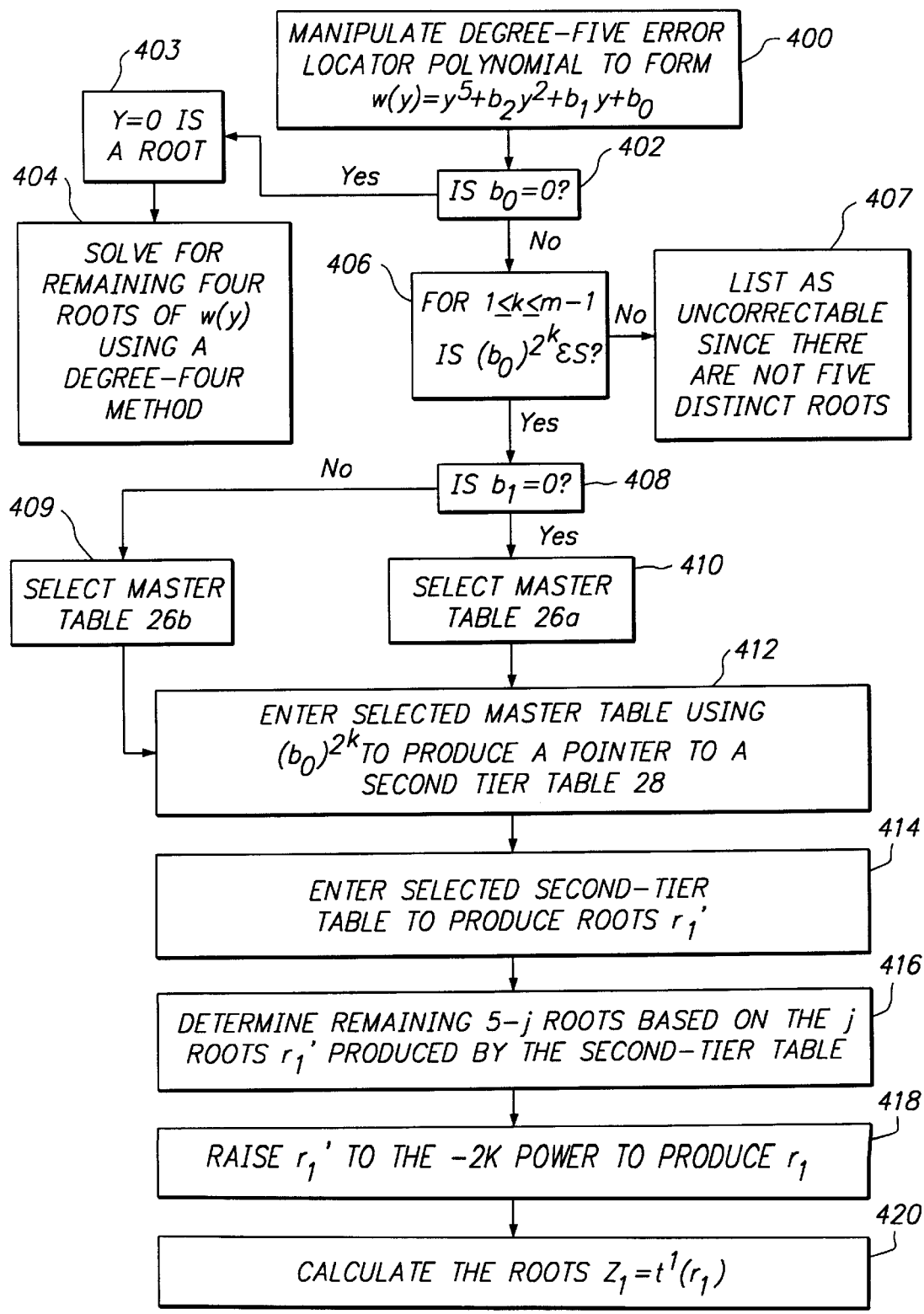
FIG. 4 is a flow chart of the operations of the system of FIGS. 2 and 3.

Referring now also to FIG. 4, the system finds the roots of a degree-five polynomial using the two tiers of tables by first manipulating the degree-five error locator polynomial to produce a polynomial of the form of equation 2 (step 400). If $b_0=0$, the system determines that $y=0$ is a root and determines the remaining roots using a method for solving degree-four polynomials (step 404). If the coefficient $b_0$ is non-zero, the system determines a value of k such that $(b_0)^{2^k}=b_0'$, where $b_0'$ is an element of the set S (steps 402, 406). To do this the system either enters a lookup table (not shown) using $b_0$ to produce an associated value of k, or it calculates the value of k by raising the coefficient $b_0$ of equation 2 to the $2^k$ power, where $k=0, 1 \ldots M-1$ and determining if the result is an element of the set S. The system thus repeatedly squares the coefficient $b_0$ until the result is equal to one of the elements of S, or all possible values of k have been tried. If $b_0^{2^k}$ is not an element of S, the system determines that there are no solutions with five distinct roots (step 407).

If a value for k can be determined, the system uses the coefficient $(b_1)^{2^k}=b_1'$ to select one of the master tables 26a or 26b (steps 408–410). The system then enters the selected table using $(b_0)^{2^k}$, and the table produces a pointer that directs the system to a selected one of the second-tier tables 28 (step 412).

Using the coefficient $b_2'$, the system enters the selected second-tier table 28, which produces a predetermined number of roots $r_i'$ (step 414). The system then, as necessary, uses the stored roots to produce the remaining roots (step 416). If four roots are stored, the system adds them to determine the fifth root $r_4'$. If fewer than four roots are stored, the system uses the stored roots to produce a polynomial of degree $5-j$, where j is the number of stored roots, and then determines the remaining roots by solving this reduced-degree polynomial using known techniques. For example, the system may store three roots $r_0'$, $r_1'$ and $r_2'$ in the table and produce a quadratic equation that it solves using known techniques to produce $r_3'$ and $r_4'$.

The system next calculates the roots $r_i$ from the roots $r_i'$ by raising the roots to the $-2^k$ power (step 418). It then determines the roots $x=z_i$ by calculating $t^{-1}(r_i)$ for $i=0, 1 \ldots 4$ (step 420).

Instead of using two-tiers of tables, Table 1 may be re-arranged such that it is addressed by a hash of the coefficients $b_2'$ and $b_0'$. The table thus becomes:

TABLE 2

| $b_2'$, $b_0'$ | Roots |
|---|---|
| $0, \alpha^0$ | $\alpha^9, \alpha^{19}, \alpha^{21}, \alpha^{36}$ |
| $\alpha^{23}, \alpha^1$ | $\alpha^{22}, \alpha^{27}, \alpha^{43}, \alpha^{47}$ |
| $\alpha^{20}, \alpha^5$ | $\alpha^{16}, \alpha^{21}, \alpha^{40}, \alpha^{57}$ |
| $\alpha^{46}, \alpha^{13}$ | $\alpha^{24}, \alpha^{32}, \alpha^{41}, \alpha^{49}$ |
| $\alpha^0, \alpha^{27}$ | $\alpha^9, \alpha^{14}, \alpha^{23}, \alpha^{49}$ |
| $\alpha^{45}, \alpha^{27}$ | $\alpha^6, \alpha^{18}, \alpha^{37}, \alpha^{44}$ |
| any other $b_2'$, $b_0'$ | no solution |

The coefficients $b_2'$ and $b_0'$ are expressed as M-bit symbols that are powers of the primitive element $\alpha$ modulo the irreducible polynomial that generates the field $GF(2^M)$. A hashed address is formulated from selected bits of each of the coefficient pairs listed in Table 2. If the $b_2'$, $b_0'$ pairs are treated as 2M columns of bits, the system preferably uses for the hashed address the columns that contain a number of 1s that are equal to one half of the size of the table. In the example, the columns 11, 10 and 1 are selected and the hashed address for the $b_2'$, $b_0'$ pairs are:

| $b_2'$, $b_0'$ | M-bit symbols | hashed address |
|---|---|---|
| $0, \alpha^0$ | 000000, 000001 | 000 |
| $\alpha^{23}, \alpha^1$ | 101001, 000010 | 101 |
| $\alpha^{20}, \alpha^5$ | 111100, 100000 | 110 |
| $\alpha^{46}, \alpha^{13}$ | 110010, 001010 | 111 |
| $\alpha^0, \alpha^{27}$ | 000001, 001110 | 001 |
| $\alpha^{45}, \alpha^{27}$ | 011001, 001110 | 011 |

The hashed addresses 010 and 100 are associated with the "no solution" entry.

If a hashed address is used, the system must check that the set of roots extracted from the table is a solution to equation 5. The system thus substitutes the roots into the equation.

B. Operations of the Polynomial Transform Processor

We discuss below the operations of the polynomial transform processor 14 (FIG. 1), which are based on a discussion in Berlekamp's book *Algebraic Coding Theory*, McGraw-Hill Book Company, 1968. The polynomial transform processor 14 determines how to manipulate the error locator polynomial:

$$0 = x^5 + a_4 x^4 + a_3 x^3 + a_2 x^2 + a_1 x + a_0 \quad [1]$$

to produce $$w(y) = y^5 + b_2 y^2 + b_1 y + b_0 \quad [2]$$

based, in part, on the values of the coefficients $a_3$ and $a_4$.

If $a_3$ and $a_4$ are both zero, the error locator polynomial is in the form of equation 2, with $x=y$. If $a_4 \neq 0$ and $a_3=0$, the system determines if $a_1=a_4^4$, and if so sets $y=a_4+x$. Substituting $x=y+a_4$ into the polynomial, the coefficients of equation 2 are then $b_2 = a_2$ $b_1 = 0$ $b_0 = a_0 + a_4^5 + a_2 * a_4^2$ If $a_1 \neq a_4$ and $a_3 = 0$, the system sets $$y = \frac{a_4 + x}{E}$$

and the coefficients of equation 2 are $$b_2 = \frac{a_2}{E^3}$$

$$b_1 = 0 \text{ or } 1$$

$$b_0 = \frac{a_0 + a_1 * a_4 + a_2 * a_4^2}{E^5}$$

where $E = (a_1 + a_4^4)^{1/4}$.

If $a_3 \neq 0$, we let $$v = x + \frac{a_2}{a_3}$$

and equation 1 becomes $$v + \left(a_4\frac{a_2}{a_3}\right)v^4 + a_3v^3 + 0v^2 + Fv + G = 0 \quad [1^*]$$

where $F = a_1 + a_3\left(\frac{a_2}{a_3}\right)^2 + \left(\frac{a_2}{a_3}\right)^4$ and $$G = a_0 + a_1\left(\frac{a_2}{a_3}\right) + a_2\left(\frac{a_2}{a_3}\right)^2 + a_3\left(\frac{a_2}{a_3}\right)^3 + a_4\left(\frac{a_2}{a_3}\right)^4 + \left(\frac{a_2}{a_3}\right)^5$$

If G=0, it implies that $$x + \frac{a_2}{a_3}$$

is a factor of equation 2, and thus, that the remaining roots can be determined by solving a degree-four polynomial.

If $G \neq 0$, we let $$s = \frac{1}{v}$$

and divide the coefficients of equation 1* by G to produce $$s^5 + \left(\frac{F}{G}\right)*s^4 + \left(\frac{a_3}{G}\right)*s^2 + \left(\frac{H}{G}\right)*s + \frac{1}{G} = 0 \quad [1^{**}]$$

where $H = \frac{a_4 a_3 + a_2}{a_3}$

The coefficient of $s^3$ in this equation is zero and the equation can be manipulated as discussed above, based on the values of the coefficients of $s^4$ and s, to produce an expression in the form of equation 2. The system next determines the roots $s=r_i$ of equation 1** and transforms them first to the roots of equation 1* and then to the roots $x=z_i$ of equation 1.

C. Finding Roots of Error Locator Polynomials of Degree e<5

The method of finding the roots of a degree-five error locator polynomial discussed above may also be used to find the roots of polynomials of degree e<5. As discussed below, the tables used to find these roots include in the entries 5−e multiple roots that correspond to unused error locations.

The degree e polynomial may be multiplied by $x^{5-e}$ to produce a degree-five polynomial. The coefficients of one or more of $a_0, a_1, a_2$ and $a_3$ are then equal to zero, which implies multiple roots at x=0. Accordingly, the lookup tables must be expanded to include roots that correspond to the equations with these zero-valued coefficients.

The system manipulates this degree-five polynomial as discussed above and the associated coefficients $b_0'$ and $b_2'$ are used to enter the expanded table. The system ignores the 5−e multiple roots at x=0, and uses the remaining e roots to determine the error locations as discussed above. Generally, the location x=0 is not used as an error location, unless the system is using an extended code. Accordingly, no error location information is lost by ignoring the multiple error locations at x=0.

Indeed, the systems generally use shortened codes and there are thus multiple unused error locations. If a code of length N is used, where N<M−1 and $2^M - 1 - N \geq 4$ there are unused locations that correspond to $\alpha^{-N}, \alpha^{-(N+1)} \ldots \alpha^{-(2^M - 2)}$. Accordingly, these error locations should not be included in any solution to the error locator polynomial.

Using an alternative method of finding the roots of error, locator polynomials of degree e the system 10 makes use of these otherwise unused error locations. The system manipulates error locator polynomial $\sigma(x)$ to form:

$$g(x) = \sigma(x)*(x+\alpha^{-n})*(x+\alpha^{-(n+1)}) \ldots (x+\alpha^{-(n+5-e-1)}),$$

which has five distinct roots over the unshortened code. The system then manipulates g(x) as discussed above, determines the associated coefficients $b_0'$ and $b_2'$ and enters the appropriate table. The system ignores the 5−e roots that correspond to error locations that are beyond the length of the shortened code, that is, the roots that correspond to the unused error locations, and uses the remaining roots to determine the error locations.

The operations of systems for determining the roots of the error locator polynomial using the significantly smaller look-up tables involve a manipulation of the error locator polynomial and a transformation of the roots of the manipulated polynomial into the roots of the error locator polynomial. These operations are straightforward and readily implemented in hardware, software or a combination of hardware and software. Further these operations are relatively quickly performed, and thus, do no slow down the overall error correction operation.

The system has been described as including several processors. One or more of these processors may be combined to perform one or more of the various operations. Alternatively, the processors discussed above may be combinations of one or more processors that together perform the various operations.

What is claimed is:

1. A method of determining error locations in a data codeword encoded over GF ($2^M$) that includes five errors, the method including:

A. determining a degree-five error locator polynomial $\sigma(x)$ associated with the data codeword;

B. manipulating the degree-five error locator polynomial $\sigma(x)$ to produce a polynomial:

$$w(y) = y^5 + b_2 y^2 + b_1 y + b_0$$

where $b_1$=0 or 1, and y=t(x);

C. using the coefficients $b_2$ and $b_1$ to enter a $2^{2M}$ entry look-up table and extract from the table the roots $y=r_i$ of w(y); and D. manipulating the roots $y=r_i$ to produce the roots $x=z_i$ by determining $x=t^{-1}(y)$, where $t^{-1}()$ is the inverse of t().

2. The method of claim 1 further including in the step of extracting the roots from the table:

a. extracting four roots $r_0, r_1, r_2, r_3$ from the table; and b. adding the four roots to produce a fifth root $r_4 = r_0 + r_1 + r_2 + r_3$.

3. The method of claim 1 further including in the step of extracting the roots from the table:

a. extracting from the table j roots $r_i$, i=0, 1 . . . j−1, and j<5;

b. manipulating the roots $r_i$ to determine the roots $r_j, r_{j+1} \ldots, r_4$.

4. The method of claim 3 further including in the step of manipulating the roots $r_i$:

i. manipulating the roots $r_i$ to determine a polynomial of degree-(5−j); and ii. determining the roots $r_j, r_{j+1} \ldots, r_4$ by solving the degree-(5-j) polynomial.

5. A method of determining error locations in a data codeword encoded over GF ($2^M$) that includes five errors, the method including:

A. determining a degree-five error locator polynomial $\sigma(x)$ associated with the data codeword;

B. manipulating the degree-five error locator polynomial $\sigma(x)$ to produce a polynomial:

$$w(y) = y^5 + b_2 y^2 + b_1 y + b_0$$

where $b_1 = 0$ or 1, and $y = t(x)$;

C. determining a value of k such that $b_0^{2^k} = b_0'$ is an element of a set S that contains values of $b_0'$ that are associated with solutions of equations of the form of $w(y) = y^5 + b_2 y^2 + b_1 y + b_0 = 0$ that have five distinct roots;

D. using $b_0'$ and $b_2^{2^k} = b_2'$ entering a look-up table and extracting roots $r_i' = r_i^{2^k}$;

E. raising the roots $r_i'$ to the $-2^k$ power to produce roots $y = r_i$; and

F. producing roots $x = z_i$ by determining $x = t^{-1}(x)$, where $t^{-1}()$ is the inverse of $t()$.

6. The method of claim 5 further including:

a. in the step of extracting the roots from the look-up table extracting four roots $r_0', r_1', r_2',$ and $r_3'$; and b. adding the four roots to produce a fifth root $r_4' = r_0' + r_1' + r_2' + r_3'$.

7. The method of claim 5 further including:

a. in the step of extracting the roots from the table extracting j roots $r_i'$, $i = 0, 1 \ldots, j-1$, and $j < 5$;

b. manipulating the roots $r_i'$ to determine the roots $r_j', r_{j+1}' \ldots, r_4'$.

8. The method of claim 7 further including in the step of manipulating the roots $r_i'$:

i. manipulating the roots $r_i'$ to determine a polynomial of degree-(5-j); and ii. determining the roots $r_j', r_{j+1}' \ldots, r_4'$ by solving the degree-(5-j) polynomial.

9. A method of determining error locations in a data codeword encoded over GF ($2^M$) that includes five or fewer errors, the method including:

A. determining a degree-e error locator polynomial $\sigma(x)$ associated with the data codeword;

B. if $e < 5$, multiplying the error locator polynomial by $x^{5-e}$ to produce a degree-five error locator polynomial;

C. manipulating the degree-five error locator polynomial to produce a polynomial:

$$w(y) = y^5 + b_2 y^2 + b_1 y + b_0$$

where $b_1 = 0$ or 1, and $y = t(x)$;

D. determining a value of k such that $b_0^{2^k} = b_0'$ is an element of a set S that contains values of $b_0'$ that are associated with solutions of equations of the form of $w(y) = y^5 + b_2 y^2 + b_1 y + b_0 = 0$ that have five distinct roots;

E. using $b_0'$ and $b_2^{2^k} = b_2'$ entering a look-up table and extracting roots $r_i' = r_i^{2^k}$;

F. raising the roots $r_i'$ to the $-2^k$ power to produce roots $y = r_i$;

G. producing roots $x = z_i$ by determining $x = t^{-1}(x)$, where $t^{-1}()$ is the inverse of $t()$; and H. ignoring multiple roots at $x = 0$.

10. A method of determining error locations in a data codeword that includes five or fewer errors, the data codeword being encoded using a shortened code over GF ($2^M$), the method including the steps of:

A. determining a degree-e error locator polynomial $\sigma(x)$ associated with the data codeword;

B. if $e < 5$, manipulating the error locator polynomial to produce $g(x) = \sigma(x) * (x + \alpha^{-n}) * (x + \alpha^{(-n+1)}) \ldots * (x + \alpha^{-(n+5-e-1)})$, C. manipulating $g(x)$ to produce a polynomial:

$$w(y) = y^5 + b_2 y^2 + b_1 y + b_0$$

where $b_1 = 0$ or 1, and $y = t(x)$;

D. determining a value of k such that $b_0^{2^k} = b_0'$ is an element of a set S that contains values of $b_0'$ that are associated with solutions of equations of the form of $w(y) = y^5 + b_2 y^2 + b_1 y + b_0 = 0$ that have five distinct roots over an associated unshortened code;

E. using $b_0'$ and $b_2^{2^k} = b_2'$ entering a look-up table and extracting roots $r_i' = r_i^{2^k}$;

F. raising the roots $r_i'$ to the $-2^k$ power to produce roots $y = r_i$;

G. producing roots $x = z_i$ by determining $x = t^{-1}(x)$, where $t^{-1}()$ is the inverse of $t()$; and H. ignoring roots that correspond to unused error locations.

11. A method of producing a look-up table for use in determining the error locations in a data codeword with five or fewer errors encoded over GF($2^M$), the method including the steps of:

A. determining, for an equation of the form $$w(y) = y^5 + b_2 y^2 + b_1 y + b_0 = 0$$

where $b_1 = 0$ or 1, the associated values of $b_2, b_1,$ and $b_0$ that correspond to solutions with five distinct roots;

B. segmenting GF($2^M$) into conjugate classes and determining a subset of C classes that contain the values of $b_0$ determined in step A;

C. select a corresponding member $b_0'$ of each of the C conjugate classes to represent the classes;

D. determine values of $b_2$ that correspond to the C selected values of $b_0'$ and are associated with solutions of $w(y)$ that have five distinct roots;

E. producing the table by including therein at locations that are addressed by $b_0'$ and $b_2'$ the solutions of $w(y)$ that have five distinct roots.

12. The method of claim 11 including in the step of producing the table, including the solutions in the table at locations that are addressed by an address that is a hash of $b_2', b_0'$.

13. The method of claim 12 further including in the step of producing the table producing the addresses by concatenating the M-bit symbols $b_2'$ and $b_0'$ to produce 2M columns and selecting for use in the address the columns that contain a number of binary 1s that is approximately equal to one-half the number of entries in the table.

14. The method of claim 11 including in the step of producing the table, including the solutions in the table at locations that are addressed by an address that is a concatenation of $b_0'$ and $b_2'$.

15. The method of claim 11 including in the step of producing the table, producing the table as a set of tiered sub-tables, with one tier corresponding the values of $b_0'$ and including pointers to the second tier and the second tier including sub-tables that correspond to the selected values of $b_0'$ and each including entries that correspond to the associated values of $b_2'$.

16. A system of determining error locations in a data codeword encoded over $GF(2^M)$ that includes five errors, the system including:
   A. means for determining a degree-five error locator polynomial $\sigma(x)$ associated with the data codeword;
   B. means for manipulating the degree-five error locator polynomial $\sigma(x)$ to produce a polynomial:

$$w(y)=y^5+b_2y^2+b_1y+b_0$$

where $b_1=0$ or 1, and $y=t(x)$;
   C. a $2^{2M}$ entry lookup table that includes solutions to $w(y)$ that have five distance roots;
   D. addressing means for using the coefficients $b_2$ and $b_1$ to enter the $2^{2M}$ entry look-up table and extract from the table the roots $y=r_i$ of $w(y)$; and
   E. means for manipulating the roots $y=r_i$ to produce the roots $x=z_i$ by determining $x=t^{-1}(y)$, where $t^{-1}()$ is the inverse of $t()$.

17. The system of claim 16 wherein the lookup table has stored four roots $r_0, r_1, r_2, r_3$ and includes an adder for adding the four roots to produce a fifth root $r_4=r_0+r_1+r_2+r_3$.

18. The system of claim 16 wherein the lookup table has stored j roots $r_i$, i=0, 1 . . . j−1, with j<5 and the system further includes means manipulating the stored roots $r_i$ to determine the roots $r_j, r_{j+1} \ldots, r_4$.

19. The system of claim 18 further including in the means for manipulating the stored roots:
   i. means for manipulating the roots $r_i$ to determine a polynomial of degree-(5−j); and
   ii. means of determining the roots $r_j, r_{j+1} \ldots, r_4$ by solving the degree-(5−j) polynomial.

20. A system for determining error locations in a data codeword encoded over $GF(2^M)$ that includes five errors, the system including:
   A. means for determining a degree-five error locator polynomial $\sigma(x)$ associated with the data codeword;
   B. means for manipulating the degree-five error locator polynomial $\sigma(x)$ to produce a polynomial:

$$w(y)=y^5+b_2y^2+b_1y+b_0$$

where $b_1=0$ or 1, and $y=t(x)$;
   C. means for determining a value of k such that $b_0^{2^k}=b_0'$ is an element of a set S that contains values of $b_0'$ that are associated with solutions of equations of the form of $w(y)=y^5+b_2y^2+b_1y+b_0=0$ that have five distinct roots;
   D. a C element lookup table, where C is associated with the number of conjugate classes that contain solutions to $w(y)$ that include five distinct roots;
   D. address means for entering the lookup table, addressing means using $b_0'$ and $b_2^{2^k}=b_2'$ to enter the table and extract the roots $r_i'=r_i^{2^k}$;
   E. means for raising the roots $r_i'$ to the $-2^k$ power to produce roots $y=r_i$; and
   F. means for producing roots $x=z_i$ by determining $x=t^{-1}(x)$, where $t^{-1}()$ is the inverse of $t()$.

21. The system of claim 20 wherein the lookup table includes for each entry four roots $r_0', r_1', r_2',$ and $r_3'$, the system further including an adder that adds the four roots to produce a fifth root $r_4'=r_0'+r_1'+r_2'+r_3'$.

22. The system of claim 20 wherein the lookup table includes for each entry j roots $r_i'$, i=0, 1 . . . , j−1, with j<5 and the system further includes means for manipulating the roots $r_i'$ to determine the roots $r_j', r_{j+1}' \ldots, r_4'$.

23. The system of claim 22 wherein the means for manipulating the roots $r_i'$ manipulate the roots $r_i'$ to determine a polynomial of degree-(5−j), and determines the roots $r_j', r_{j+1}' \ldots, r_4'$ by solving the degree-(5−j) polynomial.

24. A system for determining error locations in a data codeword encoded over $GF(2^M)$ that includes five or fewer errors, the method including:
   A. means for determining a degree-e error locator polynomial $\sigma(x)$ associated with the data codeword, the means multiplying the error locator polynomial by $x^{5-e}$ to produce a degree-five error locator polynomial if e<5;
   B. means for manipulating the degree-five error locator polynomial to produce a polynomial:

$$w(y)=y^5+b_2y^2+b_1y+b_0$$

where $b_1=0$ or 1, and $y=t(x)$;
   C. means for determining a value of k such that $b_0^{2^k}b_0'$ is an element of a set S that contains values of $b_0'$ that are associated with solutions of equations of the form of $w(y)=y^5+b_2y^2+b_1y+b_0=0$ that have five distinct roots;
   D. a C element lookup table, where C is associated with the number of conjugate classes that contain solutions to $w(y)$ that include five distinct roots;
   E. addressing means for entering the lookup table, the addressing means using $b_0'$ and $b_2^{2^k}=b_2'$ to enter the table and extract roots $r_i'=r_i^{2^k}$;
   F. means for raising the roots $r_i'$ to the $-2^k$ power to produce roots $y=r_i$;
   G. means for producing roots $x=z_i$ by determining $x=t^{-1}(x)$, where $t^{-1}()$ is the inverse of $t()$, the means ignoring multiple roots at $x=0$.

25. A system for determining error locations in a data codeword that includes five or fewer errors, the data codeword being encoded using a shortened code over $GF(2^M)$, the system including:
   A. means for determining a degree-e error locator polynomial $\sigma(x)$ associated with the data codeword, the means manipulating the error locator polynomial to produce $g(x)=\sigma(x)*(x+\alpha^{-n})*(x+\alpha^{-(n+1)}) \ldots *(x+\alpha^{-(n+5-e-1)})$, if e<5;
   B. means for manipulating $g(x)$ to produce a polynomial:

$$w(y)=y^5+b_2y^2+b_1y+b_0$$

where $b_1=0$ or 1, and $y=t(x)$;
   C. a C element lookup table, where C is associated with the number of conjugate classes that contain solutions to $w(y)$ that include five distinct roots;
   D. means for determining a value of k such that $b_0^{2^k}=b_0'$ is an element of a set S that contains values of $b_0'$ that are associated with solutions of equations of the form of $w(y)=y^5+b_2y^2+b_1y+b_0=0$ that have five distinct roots over an associated unshortened code;
   E. addressing means entering the look-up table for using $b_0'$ and $b_2^{2^k}=b_2'$ to enter a look-up table and extract roots $r_i'=r_i^{2^k}$;
   F. means for raising the roots $r_i'$ to the $-2^k$ power to produce roots $y=r_i$;
   G. means for producing roots $x=z_i$ by determining $x=t^{-1}(x)$, where $t^{-1}()$ is the inverse of $t()$, the means ignoring roots that correspond to unused error locations.

26. A system for producing a look-up table for use in determining the error locations in a data codeword with five or fewer errors encoded over $GF(2^M)$, the system including:

A. manipulation means for determining, for an equation of the form $$w(y)=y^5+b_2y^2+b_1y+b_0$$

where $b_1=0$ or 1, the associated values of $b_2$, $b_1$, and $b_0$ that correspond to solutions with five distinct roots;

B. means for segmenting $GF(2^M)$ into conjugate classes and determining a subset of C classes that contain the values of $b_0$ determined the manipulation means;

C. means for selecting a corresponding member $b_0'$ of each of the C conjugate classes to represent the classes;

D. means for determining values of $b_2$ that correspond to the C selected values of $b_0'$ and are associated with solutions of $w(y)$ that have five distinct roots;

E. addressed storage location means for producing the table by including therein at locations that are addressed by $b_0'$ and $b_2'$ the solutions of $w(y)$ that have five distinct roots.

27. The system of claim 26 wherein the addressed storage location means includes the solutions in the table at locations that are addressed by a hash of $b_2'$, $b_0'$.

28. The system of claim 27 wherein the addressed storage location means further includes the solutions in the table at locations that are addressed by concatenating the M-bit symbols $b_2'$ and $b_0'$ to produce 2M columns and selecting for use in the address the columns that contain a number of binary is that is approximately equal to one-half the number of entries in the table.

29. The system of claim 26 wherein the addressed storage location means further includes the solutions in the table at locations that are addressed by a concatenation of the symbols $b_0'$ and $b_2'$.

30. The system of claim 26 wherein the addressed storage location means further includes means for producing the table as a set of tiered sub-tables, with one tier corresponding the values of $b_0'$ and including pointers to the second tier and the second tier including sub-tables that correspond to the selected values of $b_0'$ and each including entries that correspond to the associated values of $b_2'$.

* * * * *